United States Patent
Bodö et al.

(10) Patent No.: US 6,188,138 B1
(45) Date of Patent: *Feb. 13, 2001

(54) BUMPS IN GROOVES FOR ELASTIC POSITIONING

(75) Inventors: Peter Bodö, Lindköping; Hjalmar Hesselbom, Huddinge, both of (SE)

(73) Assignee: Telefonaktiebolaget LM Ericsson (pub), Stockholm (SE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/995,202

(22) Filed: Dec. 19, 1997

(30) Foreign Application Priority Data

Dec. 19, 1996 (SE) .................................. 9604678

(51) Int. Cl.[7] .......................... H01L 23/48; H01L 23/52; H01L 29/40; H01L 23/10
(52) U.S. Cl. .................... 257/778; 257/688; 257/737; 257/777
(58) Field of Search .............................. 33/645; 257/738, 257/777, 778, 797

(56) References Cited

U.S. PATENT DOCUMENTS

| | | | | |
|---|---|---|---|---|
| 3,484,944 | * | 12/1969 | Pryshlak | 33/645 |
| 4,330,935 | * | 5/1982 | Blair, Jr. et al. | 29/844 |
| 4,818,728 | | 4/1989 | Rai et al. | 437/209 |
| 4,941,255 | * | 7/1990 | Bull | 29/833 |
| 5,010,389 | * | 4/1991 | Gansauge et al. | 257/737 |
| 5,214,308 | | 5/1993 | Nishiguchi et al. | 257/692 |
| 5,322,816 | | 6/1994 | Pinter | 437/203 |
| 5,340,296 | | 8/1994 | Schreiber et al. | 425/123 |
| 5,406,701 | | 4/1995 | Pepe et al. | 29/840 |
| 5,411,400 | * | 5/1995 | Subrahmanyan et al. | 439/68 |
| 5,454,055 | | 9/1995 | Kragl et al. | 385/14 |
| 5,465,152 | * | 11/1995 | Bilodeau et al. | 356/371 |
| 5,472,886 | | 12/1995 | Dautartas et al. | 437/23 |
| 5,523,628 | * | 6/1996 | Williams et al. | 257/777 |
| 5,726,502 | * | 3/1998 | Beddingfield | 257/797 |
| 5,828,128 | * | 10/1998 | Higashiguchi et al. | 257/738 |
| 5,998,875 | * | 12/1999 | Bodo et al. | 257/778 |
| 6,020,561 | * | 2/2000 | Ishida et al. | 174/261 |

FOREIGN PATENT DOCUMENTS

| | | | |
|---|---|---|---|
| 4438053 | | 5/1996 | (DE) . |
| 0276900 | * | 8/1988 | (EP) ................................ 33/645 |
| 0295914 A2 | | 12/1988 | (EP) . |
| 0453716 A2 | | 10/1991 | (EP) . |
| 0082009 | * | 11/1951 | (JP) ................................ 33/645 |
| 0661490 | * | 11/1951 | (GB) ............................... 33/645 |
| 0082009 | * | 6/1980 | (JP) ................................ 33/645 |

* cited by examiner

Primary Examiner—Peter S. Wong
Assistant Examiner—Pia Tibbits
(74) Attorney, Agent, or Firm—Burns, Doane, Swecker & Mathis, L.L.P.

(57) ABSTRACT

This invention belong to a mounting technology for aligning parts, a self-aligned elastic positioning. A problem this invention solves is alignment of parts without using mechanical fine pre-alignment. Wherein one part has elastic bumps, another part has V-grooves and the parts fit into each other. The invention is using elastic material for the bumps to fit the V-grooves. Whereas the bumps are made of elastic material and shaped partly to the V-bumps by moulding. The two parts can slide along in the direction perpendicular to the plane of the surface of the part. The movement in the perpendicular direction can be controlled by an external force. This means that the bumps and V-grooves have good alignment in xy-orientation and are also partial aligned in z-orientation. The elasticity of the bumps allows for thermal expansion differences without stresses to the parts while maintaining high precision alignment at a point. By using this type of parts they can be disassembled and be replaced without destroying the alignment features.

22 Claims, 3 Drawing Sheets

BUMPS IN GROOVES FOR ELASTIC POSITIONING

TECHNICAL FIELD OF THE INVENTION

The present invention relates to a mounting technology for aligning parts in electronic field, more particularly to a fast and easy self-aligned elastic high precision positioning, where one part has bumps, another part has V-grooves and the parts fit into each other.

DESCRIPTION OF RELATED ART

The technical evolution in the field of electronics, has resulted in a demand for faster and more compact systems. In many applications a compact structure combined with a low weight is in itself a requirement. The technical evolution also tends towards more complex systems involving a greater and greater number of components, which need to communicate with each other. In order to meet the requirement of quick access between different components for the new systems the length of the paths between different components of the system must be kept within certain limits. When the complexity of a system grows, the length of the paths between components also grows. In order not to exceed the maximum allowed distance between such components, these components have been built smaller and smaller and they have also been packed more and more densely.

The relative position of one part to another in a system is in many cases a critical task. For this purpose there is no existing technology offering an elastic high precision self alignment of a part at a micrometer or even sub-micrometer scale. Lateral and sometimes even 3-dimensional positioning requires the use of advanced aligning equipment to join parts together, also reliable methods and materials are needed to maintain their positions even under severe external conditions, such as temperature cycling. If parts in the system consist of materials with different thermal expansion coefficients, then solid joints may cause problems due to stresses arising from temperature variations. In the field of electronic and optronic production the demands on very accurate positioning are increasing with reduced dimensions and more advanced packaging. For example, thermal expansion may cause severe problems due to displacement of a laser used to output light to a single mode optical fiber. In another example, thermal expansion induced stresses will damage electrical interconnects to a die flip-chip mounted on a substrate of a different thermal expansion coefficient than the die itself. Another aspect is that as packages have increased number and complexity of the integrated circuits, IC:s, easy repair will be necessary to achieve sufficient yield.

Alignment has been achieved by using a surface, a wall corner extending from that surface and then securing the system by, e.g., glueing, soldering etc. If the aligned parts expand differently due to heating when they are in use different things may happen. If the fastening is very stiff, the expansion will cause stress and eventually some warping or possibly breakage. The alignment is at least lost in one dimension.

Consider the relative positioning of two individual parts. This can be and has previously been achieved by using grooves for registration, for example, V-grooves have been made by anisotropic wet chemical etching in silicon to fit with protruding structures such as balls, pins, or V-hills in the other part.

One way to get fine pre-alignment of flip-chips is to use mechanical placement equipment before soldering the two parts together.

Another way is to use the flip-chip soldering itself, which includes alignment features. The actual alignment determining solder joint has to be destroyed when separating and a new one formed for the replaced part.

Existing methods offer alignment with stiff joints, but these can cause expansion and mismatch problems, such as damage or sudden misalignment in one direction.

The U.S. Pat. No. 5,214,308, Masanori Nishiguchi et al., describes a micro aligning method, which is based on bumps and grooves. It describes alignment before permanent attachment to the base substrate. The bumps and grooves are not shaped exactly after like each other.

SUMMARY

This invention solves the problem of alignment of parts without using mechanical fine pre-alignment.

This invention has the ability to obtain and maintain very precise alignment in combination with elasticity to handle, e.g., expansion mismatch at a central or arbitrary point of the aligned parts by careful placement of the bumps and grooves. The grooves may be of 5 corner pentahedron or pyramidical form and the bumps may be of truncated 5 corner pentahedron or truncated pyramidical form. The invention does not need any fine pre-alignment since the alignment structures are very large compared to the precision they offer wherein the parts automatically will come into the right position when pressed together after a rough pre-alignment.

The present invention uses elastic material for the protruding parts to perfectly fit the V-grooves. To achieve this, the bumps are made of elastic material and shaped partly to the V-bumps by moulding. A mould is used as a mating part or a similar mould is used identical or similarly shaped as the V-grooves. Using these V-shaped bumps and grooves, the bumps will align automatically into the V-grooves when the two parts are brought together.

This solution has at least one fixed arbitrary point, which would be between two adjacent bumps and grooves in the plane of the surface of the two parts. The two parts can slide along each other. The movement in the perpendicular direction, i.e., height difference between the two parts, can be controlled by an external force or by the size of bump. This means that the bumps and V-grooves have good alignment in the X-Y plane and are also partially aligned along the z axis.

The non-permanent bumps in grooves alignment techniques automatically achieve high precision without the bumps acting as the joining part, provided that there is some other force pressing the two parts together. By using these types of parts they can be disassembled and continuously replaced without destroying the alignment features.

One advantage of the present invention is that continued high precision alignment of parts will be stable when external mechanisms cause effects on the parts.

Another advantage of the present invention is the changeability and replacebility of parts in the advanced packaging system.

Another advantage of the present invention is that the parts can absorb elastic changes and still be aligned along a line in the X-Y plane.

Another advantage of the present invention is that the parts can be reused and kept in alignment, even after a very large number of matings.

Another advantage of the present invention is that the bumps and grooves are formed to mate perfectly in order to perform maximum alignment.

Another advantage of the present invention is that manufacturing reproducibility is very high and uses simple techniques forecasting low production costs.

A further advantage of the present invention is that the invention results in very precise alignment and freedom of stress for micro parts produced using more or less standard planar techniques in combination with moulding of elastic compound.

A still further advantage of the present invention is that the invention can maintain alignment even if there is thermal displacement of parts.

The invention is now being described further with the help of the detailed description of the preferred embodiments and the attached drawings.

DETAILED DESCRIPTION OF EMBODIMENTS

This invention describes a technology for fast and easy non-permanent elastic self-aligned high precision mounting so that assembling of parts requires only coarse external alignment, while maintaining predefined elasticity to limit stresses due to thermal and other mismatches.

Figure 1A:
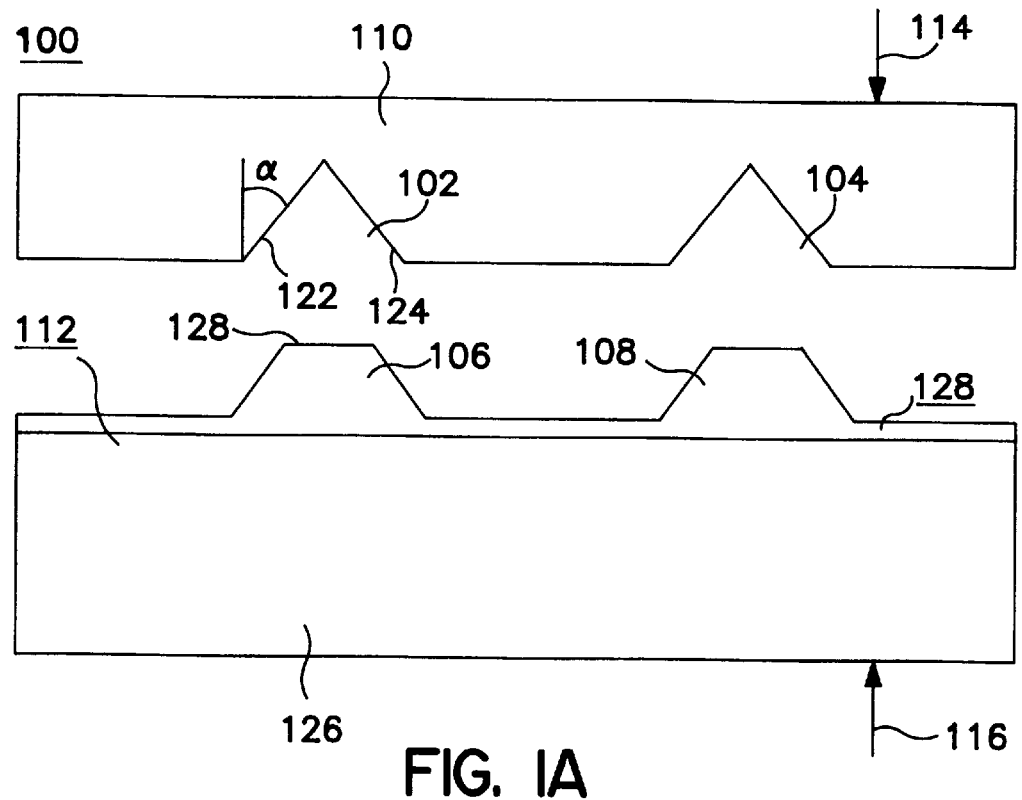
FIG. 1a shows a cross-section of two parts at a distance from each other, using elastic bumps in V-grooves.
Figure 3:
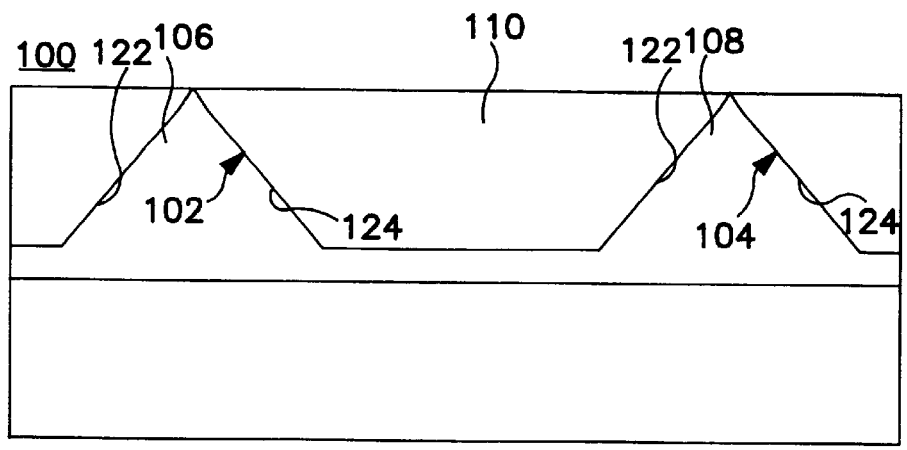
FIG. 3 is a cross-sectional side view of two parts aligned using bumps and grooves that are the same size and shape.

FIG. 1 and FIG. 3 show embodiments of the present invention. This invention can of course be used in any kind of micrometer or even sub-micrometer system. In FIG. 1 there is shown a preferred embodiment of the present invention, an aligning structure 100. FIG. 1a shows a first part 110 with V-grooves 102, 104 moved down to fit moulded bumps 106, 108 on a second part 112. The precision of the positioning is determined by the technology and the materials used to prepare the bumps 106, 108 and the V-grooves 102, 104. The first part 110 is made of, for example, a single crystalline Si-wafer (100), and the second part 112 consists of a substrate 126 and a structure 128 with bumps. The bumps 106, 108 are made of an elastic material such as, for example, a silicone elastomer. Of course, the two parts 110, 112 can have the bumps 106, 108 or the V-grooves 102, 104 also on the opposite side of the two parts 110, 112. Each part 110, 112 may have both V-grooves and bumps on the same part and on the same or opposite side of the part. The second part can for example be a Si-wafer.

Figure 1B:
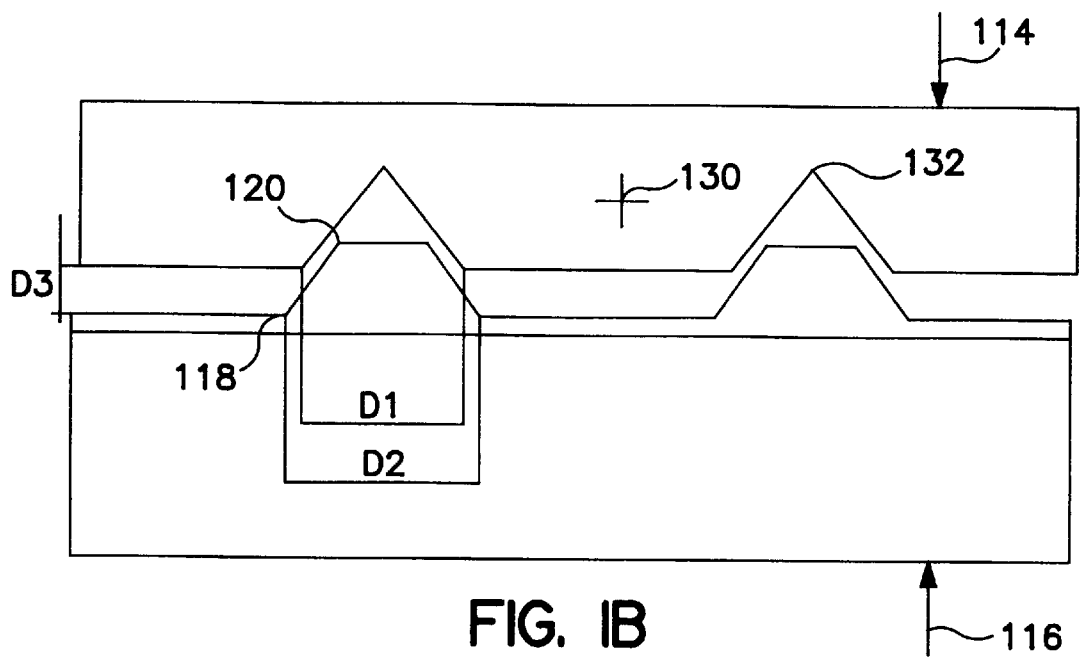
FIG. 1b shows a cross-section of parts with elastic bumps in V-grooves which are brought together.

In a method for aligning the structure 100, as seen with reference to FIG. 1b, firstly, the two parts 110, 112, which have the V-grooves 102, 104 and the bumps 106, 108, will be placed by some pre-alignment, such that a top part 126 of the bumps 106, 108, are within the periphery of the V-grooves openings. Secondly, a force 114 and/or a force 116 is/are continuosly applied on the aligning structure 100, the bumps 106, 108 will slide on inclined walls 122, 124 of the V-grooves to get very precise alignment in the directions parallel to a base surface of the bumps 106, 108 or the V-grooves 102, 104.

Separating the two parts 110, 112 can be done by taking away the force 114 and/or the force 116 on the aligning structure 100 and then separating the two parts 110, 112. The separation is possible because the alignment structure 100 has no permanent parts 110, 112 attached to each other. Therefore it is easy to separate if replacement or repair is needed.

When the alignment structure 100 is in alignment, it may occur, for example, that the first part 110 in FIG. 1b expands relative to the second part 112 and forces 114, 116 have been applied to the two parts 110, 112 and different effects occurs on the two parts. One effect is, if the forces 114, 116 pressing the two parts 110, 112 together are relatively low, the bumps 106, 108 will start sliding out of the V-grooves 102, 104. Essentially, the aligning structure 100 maintains lateral alignment of a fixed point 130, which is in between the bumps 106, 108, whereas the vertical misalignment can be larger than the expansion between the bumps 106, 108 due to the angle of the walls in the grooves 102, 104.

As the aligning structure 100 has moving parts 110, 112, it will come back to its original position. Another effect is, if the forces 114, 116 that are holding the two parts 110, 112 together are low, the lateral alignment of the fixed point 130 will be maintained, but there might be some vertical displacement. A third effect is, if the forces 114, 116 are strong the different expansion of the parts of the aligning structure 100 is taken up by the elastic bumps 106, 108, maintaining lateral alignment as well as vertical alignment for a fixed point 130 or line. A further effect is, if the forces 114, 116 are relatively strong, essentially not allowing any considerable vertical movement, the expansion will deform the bumps 106, 108. In this situation vertical alignment and lateral alignment of the fixed point 130 in between the bumps 106, 108 are maintained. If a similar structure is made with non-elastic bumps for stiff points only very minor displacements are possible before the bumps 106, 108 are plastically deformed or destroyed.

In the alignment structure 100 itself, the bumps 106, 108, are made of elastic material and larger micro-displacements in all directions caused by thermal expansion or vibrations are possible without considerable stresses occurring in the two parts 110, 112. Combining the grooves 102, 104 with the bumps 106, 108 gives the alignment structure 100 a very good precision.

How to make the bumps 106, 108 and the grooves 102, 104 are described below. To obtain a precise alignment the V-grooves 102, 104 can be made in a substrate, e.g., Si, using anisotropic etching on (100) wafer. A more detailed description of how to make the V-grooves 102, 104 and the elastic bumps 106, 108 are found in a simultaneously filed patent application "Method for making elastic bumps", Swedish Application No. 9604675-0, corresponding to U.S. patent application Ser. No. 08/995,194. Likewise, the elastic bumps 106, 108 can be formed by using a curable silicone compound, a conformally covering release agent, and an anisotropically etched (100) Si wafer. In both cases high precision lithography is used.

Figure 2A:
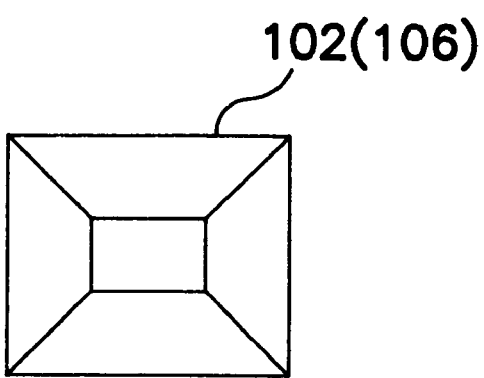
FIGS. 2a–b show top views of different grooves.
Figure 2B:
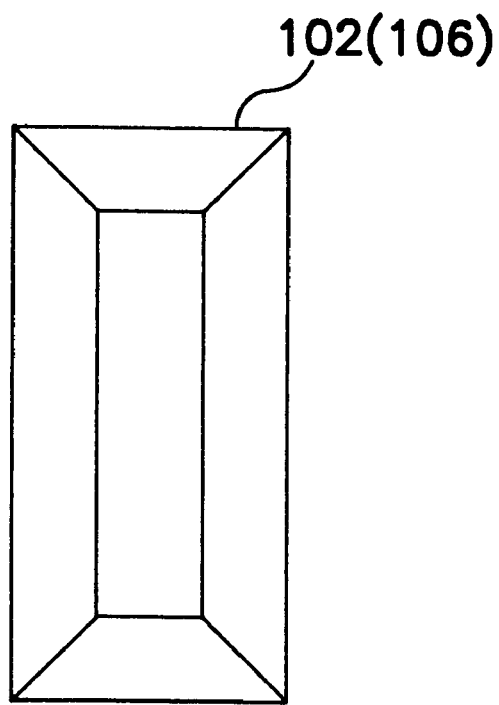

Very well defined rectangular or square V-grooves 102 (bumps 106 may have the same shape as the grooves as is reflected by the reference numeral 106 in parentheses) (FIGS. 2a–2b) can be made in a single crystalline silicon wafer if etched anisotropically. One etching technique is anisotropic etching and using (100) oriented wafers. The side walls 122, 124 are obtained in the V-grooves 102, 104 in planes, which have an angle α of 54.7° relative to a surface normal of the (100) wafer. Width D1, FIG. 1b, and position of the V-grooves 102, 104 on the wafer are determined by openings in an etch mask prepared by standard processes for electronic productions at a resolution in submicrometer range. The reproducibility of the mask lithography and silicon etching are very high.

Secondly, to make very well defined bumps 106, 108, which will fit into the above made V-grooves 102, 104 the following technique is used. A mould is used to cast the elastic bumps 106, 108 with very high precision. There are two possible ways to get the mould: either by using the first part 110 that has the V-grooves 102, 104 to make a mould, or make a similar mould that replicates the aligning edges of the second part 112 to a very high degree. In this case FIG. 1 shows that the bumps are made by a similar mould, which is to its form the same as the bumps 106, 108. Because of the very high reproducibility of V-groove etching, the similar mould can be made such that the bumps 106, 108 fit the V-grooves 102, 104 exactly as desired and predetermined. For example, if the bumps 106, 108 are made wide at a foot of the bump, width D2 see FIG. 1b, it would increase a height difference D3 between the two parts 110, 112 without changing the lateral position. Also, the similar mould could be made so that the bumps 106, 108 can get a flat or truncated top 126 instead of being peaked or V-shaped, which increases vertical flexibility and also prevents the bumps 106, 108 from reaching a bottom 132 of the V-grooves 102, 104.

When specifically using curable silicones to make the bumps 106, 108, the replication of the similar mould can be very high allowing for very precise alignment when the produced bumps 106, 108 are mated with the V-grooves 102, 104.

Another method for making the preferred bumps 106, 108 and the preferred V-grooves 102, 104 is by using photolithographic masking aligned to already existing structures on, e.g., laser wafers or IC is integrated circuit wafers. Before the parts have been separated grooves are made either using anisotropic etching or other techniques. Similarly, but mirror image grooves are also made in similar or dissimilar material, which is used as a similar mould. Either this mould, or the part onto which the elastic bumps will be attached, is then covered with the elastic material in its pre-cured form, then that part and the mould is pressed together in a vacuum. The elastic material fills the grooves in the mould. After this, the elastic material is cured using heat, or possibly light if the mould or part is translucent for the curing light, and the mould separated from the elastic material.

To get high precision alignment in the direction perpendicular to the surface some controlling surface has to be applied either from the opposite side to the grooves or at the same side providing some force from an opposing side. In other words, vertical alignment of the parts can be maintained by appropriate application of an external vertical force applied on the parts or appropriate adjustment the size of the elastic bumps.

The dimensions of the V-grooves 102, 104 and the bumps 106, 108 used for positioning may be up to a size of the same order as the thickness of the wafer.

An alternative embodiment of the present invention is an aligning structure 100 using only one bump 106 and one groove 102. To get the aligning feature the bump 106 must have exactly the same walls as the walls that of the groove 102 has and be within the compressibility of the same size from bottom 118 to top 120 of the bump 106, in other words, to get high precision vertically, the compressibility and thickness of the bumps should allow connection points and still define the correct distance between the surfaces of the substrates. The bump 106 can have a cut top as before, without changing the alignment requirements. In this case the tilt and vertical position is controlled by the mating surfaces external to the bump bottom. Alternatively, the bump is made larger so as not to allow mating of the previous surfaces. Instead the surface pressing from the backside controls the tilt and, together with the bump, the vertical position.

The previously described preferred embodiment could be modified but at some loss of precision. The bumps 106, 108 could have a different shape than the V-grooves 102, 104. When making alternative bumps another mould is used. This mould would not use anisotropic etching but rather some other etching or machining. The V-grooves 102, 104 and the bumps 106, 108 do not have to have the same shape as long as the bumps fit in the grooves in a self-centering fashion. One could also mould side aligning stops on the second part, these could be used as aligning features rather than the grooves 102, 104. This would require that the aligning stops sides are well-defined with respect to the important aligning field of the two parts. Moreover, the compound could be other than silicone, i.e., polyurethane or some other elastic or semi-elastic compound.

By replicating using several steps, an elastic mould could be made easing the detachment of the mould aligning stops from the substrate but only at a loss of accuracy. This involves first moulding a body of some material and then moulding using this body as a mould for a elastic or flexible material. This then serves as a mould for the elastic bumps on a rigid material. Due to the higher number of replication steps involved accuracy will be lost.

Figure 4:
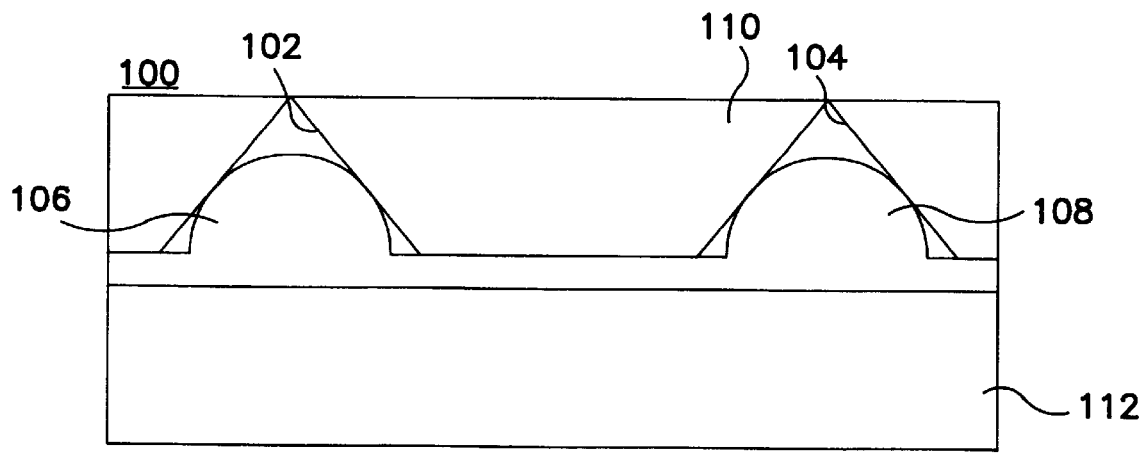
FIG. 4 is a cross-sectional side view of two parts aligned using ball-shaped bumps together with V-shaped grooves.
Figure 5:
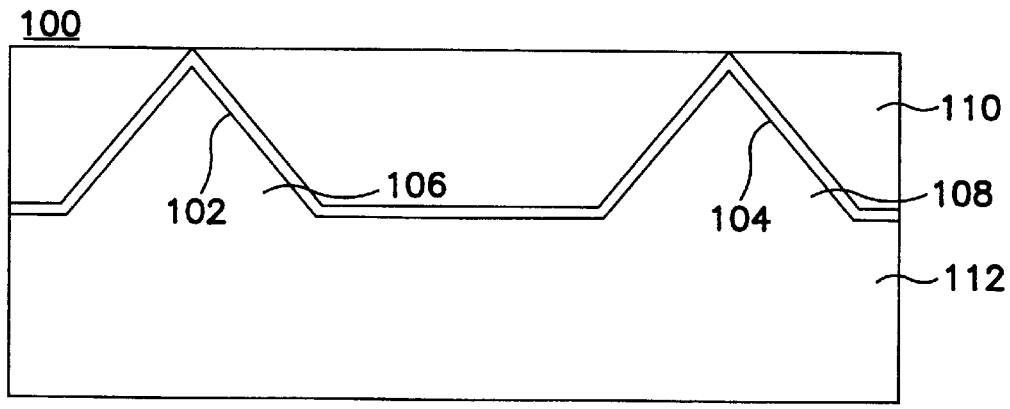
FIG. 5 is a cross-sectional side view of two parts aligned using bumps and grooves wherein the grooves are elastic-lined.

In an alternative embodiment of the bump structure, the bump is replaced with a ball or pin of elastic material (FIG. 4). The balls or pins can in another embodiment, as seen in FIG. 5, be of inelastic material but the side walls of the grooves can be covered at high precision with elastic material.

By having stiff alignment features on one side and an elastic force on the other side it would be possible to obtain "perfect" alignment at the side towards the stiff alignment feature. As the two parts expand differently, the alignment can be maintained only at that edge, whereas the misalignment would increase for positions further away from that edge.

Using stiff bumps also allow very precise vertical positioning. It would not allow for any difference in expansion between the two parts without losing alignment or exposing the two parts for severe strain.

The bumps 106, in other words, to get high precision vertically, the compressibility and thickness of the bumps should allow connection points and still define the correct distance between the surfaces of the substrates 108 and the grooves 102, 104 can, of course, be used in general micro alignment of the two parts 110, 112, and in the same fields as described in the simultaneously filed patent applications "High density electrical connectors", Swedish Application No. 9604677-6, corresponding to U.S. patent application Ser. No. 08/994,985, and "Flip-chip type connection with elastic contacts" Swedish Application No. 9604676-8, corresponding to U.S. patent application Ser. No. 08/994,981.

The invention described above may be embodied in yet another specific forms without departing from the spirit or essential characteristics thereof. Thus, the present embodiments are to be considered in all respects as illustrative and not restrictive, the scope of the invention being indicated by the appended claims rather than by the foregoing descriptions, and all changes, which come within the meaning and range of equivalency of the claims are therefore intended to be embraced therein.

What is claimed is:

1. An aligning structure comprising a first part with at least one V-groove and a second part with at least one bump, the bump being made of an elastic material and fitting in the groove, wherein the first part and the second part are aligned when the bump mates with the groove, and wherein at least one of the first part and the second part is a silicon wafer.

2. An aligning structure according to claim 1, wherein the groove and the bump are rectangular.

3. An aligning structure according to claim 1, wherein the bump is a substantial mirror image of the groove.

4. An aligning structure according to claim 1, wherein the bump is wider than a widest part of the groove.

5. An aligning structure according to claim 1, wherein the groove and the bump are of substantially a same height as a thickness of the at least one of the first part and the second part that is a silicon wafer.

6. An aligning structure according to claim 5, wherein the bump is a substantial mirror image of the groove.

7. An aligning structure according to claim 5, wherein the bump is wider than a widest part of the groove.

8. An aligning structure according to claim 1, wherein the groove has planar side walls.

9. An aligning structure according to claim 8, wherein the planar side walls of the groove are non-perpendicular to a surface of the first part.

10. An aligning structure according to claim 9, wherein the planar side walls form an angle of 54.7° to the surface of the first part.

11. An aligning structure according to claim 1, wherein the bump is a truncated triangle in cross-section.

12. An aligning structure according to claim 1, wherein the bump is semi-circular in cross-section.

13. An aligning structure according to claim 1, wherein the groove is V-shaped.

14. An aligning structure according to claim 13, wherein the bump is V-shaped.

15. An aligning structure according to claim 14, wherein the bump is sized to fit completely in the V-shaped groove.

16. An aligning structure according to claim 1, wherein the elastic material is an elastomer compound.

17. An aligning structure comprising a first part with at least one V-groove and a second part with at least one bump, the groove being lined with an elastic material and mating with the bump, wherein the first part and the second part are aligned when the bump mates with the groove, and wherein at least one of the first part and the second part is a silicon wafer.

18. An aligning structure according to claim 17, wherein the groove and the bump are rectangular.

19. An aligning structure according to claim 17, wherein the bump is a substantial mirror image of the groove.

20. An aligning structure according to claim 17, wherein the groove and the bump are of substantially a same height as a thickness of the at least one of the first part and the second part that is a silicon wafer.

21. An aligning structure according to claim 17, wherein the groove has planar side walls.

22. An aligning structure according to claim 17, wherein the elastic material is an elastomer compound.

* * * * *